(12) United States Patent
Souder, Jr.

(10) Patent No.: US 6,619,526 B1
(45) Date of Patent: Sep. 16, 2003

(54) HIGH-SPEED TAPE FEEDER FOR PICK AND PLACE MACHINES

(75) Inventor: Terry Dennis Souder, Jr., Perkasie, PA (US)

(73) Assignee: Tyco Electronics Logistics AG (CH)

( * ) Notice: Subject to any disclaimer, the term of this patent is extended or adjusted under 35 U.S.C. 154(b) by 0 days.

(21) Appl. No.: 09/491,799

(22) Filed: Jan. 26, 2000

(51) Int. Cl.[7] .......................... B65H 23/06; B65H 20/00
(52) U.S. Cl. ...................... 226/151; 226/45; 226/128; 156/344; 156/584
(58) Field of Search ................. 226/128, 146, 226/148, 151, 36, 38, 45, 59; 156/344, 584

(56) References Cited

U.S. PATENT DOCUMENTS

| | | | | |
|---|---|---|---|---|
| 3,323,700 A | * | 6/1967 | Epstein et al. | 226/45 X |
| 4,549,680 A | * | 10/1985 | Brown | 226/146 X |
| 4,820,369 A | * | 4/1989 | Kubo | 156/344 |
| 5,191,693 A | * | 3/1993 | Umetsu | 156/344 X |
| 5,725,140 A | * | 3/1998 | Weber et al. | 226/128 X |
| 5,941,674 A | * | 8/1999 | Briehl | 156/584 X |
| 6,032,845 A | * | 3/2000 | Piccone et al. | 226/128 X |
| 6,082,603 A | * | 7/2000 | Takada et al. | 226/148 X |
| 6,162,007 A | * | 12/2000 | Witte | 414/416.01 |
| 6,179,190 B1 | * | 1/2001 | Kim | 226/151 X |
| 6,199,738 B1 | * | 3/2001 | Kondo et al. | 226/128 X |

* cited by examiner

Primary Examiner—Michael R. Mansen
(74) Attorney, Agent, or Firm—John B. Sowell-Aty

(57) ABSTRACT

An automatic tape feeder for use in component placement machines includes a novel sprocket wheel for driving component carrier tapes to a gross position by an electric drive motor. Before the electric drive motor reaches the final position desired, it is deactivated or turned off. A novel indexing cam is connected to the sprocket drive wheel. A spring loaded pawl or positioning cam is moved into a vee-shaped groove on the indexing cam so as to achieve an actual fine position of the indexing cam as well as the teeth on the sprocket wheel. By first achieving a gross position with the drive motor and then a fine position with an indexing cam and pawl, it is possible to achieve a positioning accuracy in a pick up station which is as accurate as the sprocket holes and component pockets in the carrier tape. The present invention has achieved accuracies of ± one $1,000^{th}$ of one inch which exceeds positioning accuracies of devices known heretofore.

16 Claims, 11 Drawing Sheets

HIGH-SPEED TAPE FEEDER FOR PICK AND PLACE MACHINES

BACKGROUND OF THE INVENTION

1. Field of the Invention

The present invention relates to automatic component feeders of the type used in automatic component placement machines. More particularly, the present invention relates to a tape feeder for precisely positioning a sprocketed tape having a cover tape on a carrier tape which covers a recess pocket in the base tape or carrier tape for automatically positioning it in a pick up station of a pick and place machine.

2. Description of the Prior Art

Tape feeders for pick and place machines are classified in U.S. Class 226, Subclasses 62, 122, 128, 129 to 139, et al. Covered tapes for tape feeders have become standardized to the point that reels of tapes with components may be purchased from different component vendors knowing that the covered tapes will fit into most standard tape feeders. Such tapes are made to EIA industrial standards with sprocket holes on 4-mm pitch for 8-mm tapes. Like 35 mm movie film, the sprocket holes are punched in staged die sets and are highly accurate for most purposes and have been found to be more accurate than the tape positioning mechanisms used to position the tape in the pick up station.

Heretofore, tape feeders have employed sprocketed wheels which have been driven by levers, escapement pawls and gears which when activated are dependent upon the accuracy of the drive mechanism. Since all of the prior art positioning devices have free play or backlash, it has been difficult if not impossible to position the sprockets as accurately as the sprocket holes in the tape would permit.

Accordingly, it would be desirable to provide a tape feeder that is capable of accurately positioning the sprocket holes and thus the recess pockets which hold components to an extremely high degree of accuracy when operated at high speeds over long periods of time.

SUMMARY OF THE INVENTION

It is a principal object of the present invention to provide a novel tape feeder for advancing component carrier tapes into a workstation or feed station with an extremely reliable degree of positioning accuracy.

It is a principal object of the present invention to provide a novel tape feeder that is interchangeable with existing tape feeders, yet provides a higher degree of positioning accuracy than prior art tape feeders.

It is a principal object of the present invention to provide a novel sprocket drive for a tape carrier that has gross positioning gear drive and a fine positioning cam drive.

It is a principal object of the present invention to provide a highly accurate cam drive for positioning a novel sprocket after introducing backlash in the sprocket gear drive.

It is a principal object of the present invention to provide an optical interrupter sensor for a drive motor for sensing a desired gross position of the novel sprocket drive gear.

It is a principal object of the present invention to provide a continuous tape path that does not reverse direction or tend to delaminate the cover tape from its carrier tape.

It is a principal object of the present invention to provide a novel cover tape removal station that prevents components from escaping until being positioned at the final pick up station position.

It is a principal object of the present invention to provide a two-stage tape positioning mechanism that eliminates high-speed overdrive positioning of the carrier tape.

It is a general object of the present invention to provide an economical and reliable high speed tape feeder with a minimum of wearing parts that could effect the accuracy of positioning of a tape carrier.

It is a principal object of the present invention to position a tape carrier in a pick up station independent of the position achieved by the drive motor.

It is a principal object of the present invention to finally position a carrier tape in a pick up station without using the force of a drive motor.

According to these and other objects of the present invention, there is provided in a tape feeder comprising a base plate and cover plates. A motor driven gear drive is mounted on the base plate and comprises a sprocketed wheel for engaging a sprocketed carrier tape and for gross positioning recess pockets in the carrier tape into a pick up position of a work station comprising an automatic cover tape stripper. The sprocketed wheel is further provided with a positioning cam that cooperates with a mating positioning cam which fine positions the sprocketed wheel after it is gross positioned by the drive motor. In the preferred embodiment of the present invention, an optical sensor controls the drive motor to a gross position and a spring actuated drive cam then cooperates with the positioning cam on the sprocket wheel to effect fine positioning of the sprocketed wheel. The sprocketed wheel and carrier tape is then positioned to the accuracy of the carrier tape of better than ± one $1,000^{th}$ of one inch.

DESCRIPTION OF THE PREFERRED EMBODIMENTS

Figure 1:
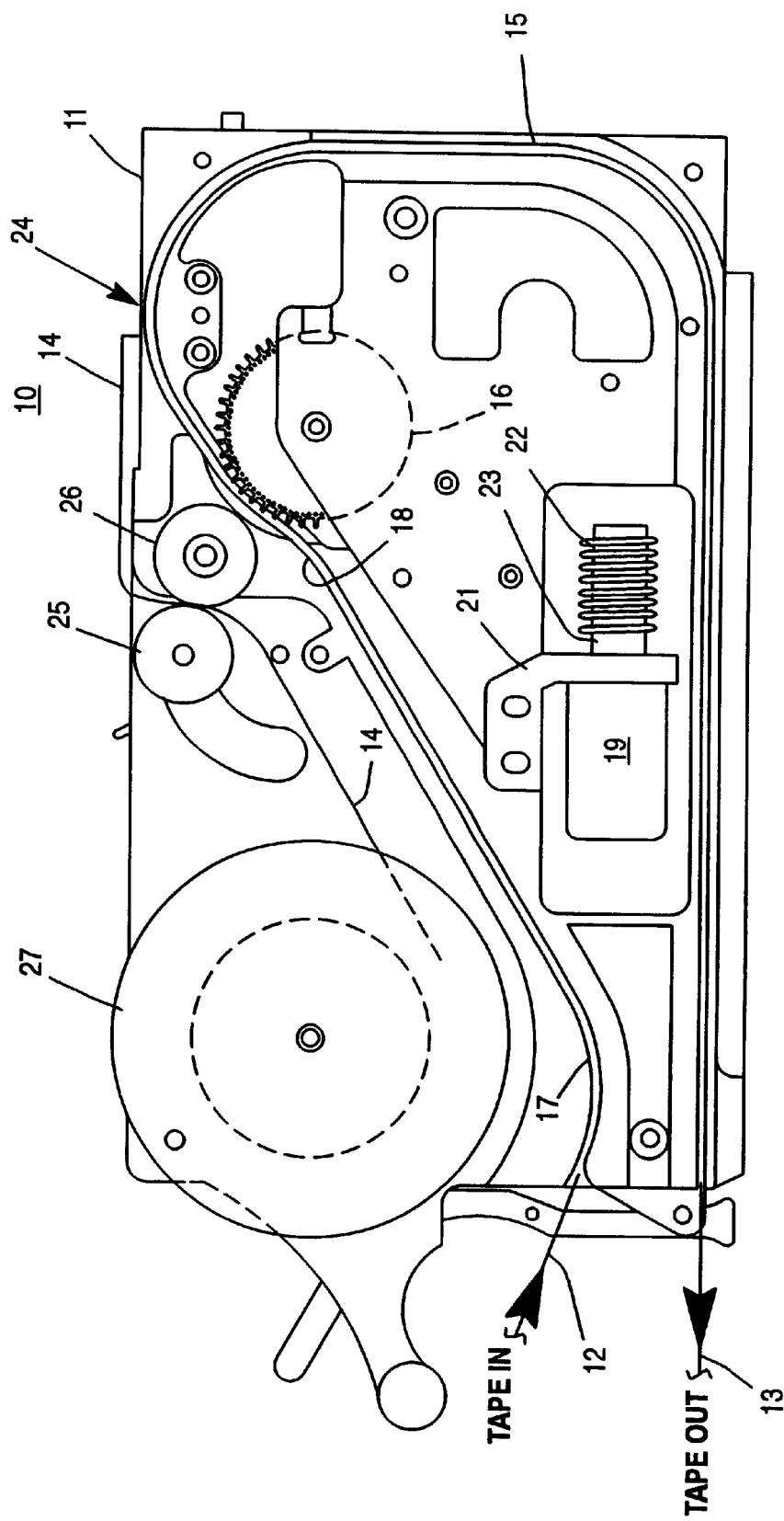
FIG. 1 is a right side elevation view of a prior art tape feeder with the right side cover plate removed to show the feed path of the component tape.

Refer now to FIG. 1 showing a right side elevation view of a prior art tape feeder 10 having a base or frame 11 with the cover plates removed (not shown). The base or frame 11 is provided with a feed path for a component two-piece tape 12 comprising a carrier tape 13 and a cover tape 14. The tape 12 is shown entering into a slot which guides the component tape to the sprocket wheel 16. As shown in FIG. 1, the tape 12 must pass through a reverse bend 17 and a reverse bend 18 in order to reach the sprocket wheel 16. Since the carrier tape is stronger and thicker than the cover tape, flexing the component tape causes the cover tape 14 to delaminate from the carrier tape 13 at the reverse bends 17 and 18. The cover tape is not tightly bonded to the carrier tape because it must be stripped or removed at the pick up station as will be explained hereinafter.

High speed electric motor 19 is supported by a bracket 21 mounted on the frame or base 11 and having a worm gear 22 mounted on the shaft 23 of the motor 19. When the motor 19 is energized, the worm gear 22 drives a plurality of external spur gears (not shown) which reduce the revolutions of the motor 19 by a factor of approximately 700 to 1 to drive the sprocketed wheel 16 which positions the component tape 12 in the pick up station 24. After the component is picked out of the pocket presented at the pick up station 24, it continues along the tape slot 15 and exits at the bottom as shown at the numeral 13. The carrier tape 13 is allowed to fall loose and may be collected periodically as trash and cut from the tape being driven through the tape feeder 10.

At the work station 24, the cover tape 14 is peeled back by a pulling action as it passes through the movable pinch roll 25 and a resilient drive roll 26. The cover tape 14 being stripped from the carrier tape 13 is shown being taken up or spooled onto a reel 27 also known as a take up reel. The take up reel 27 is normally exposed and not covered by a cover plate (not shown), so that it may be easily removed and replaced without removing the cover plate.

Figure 2:
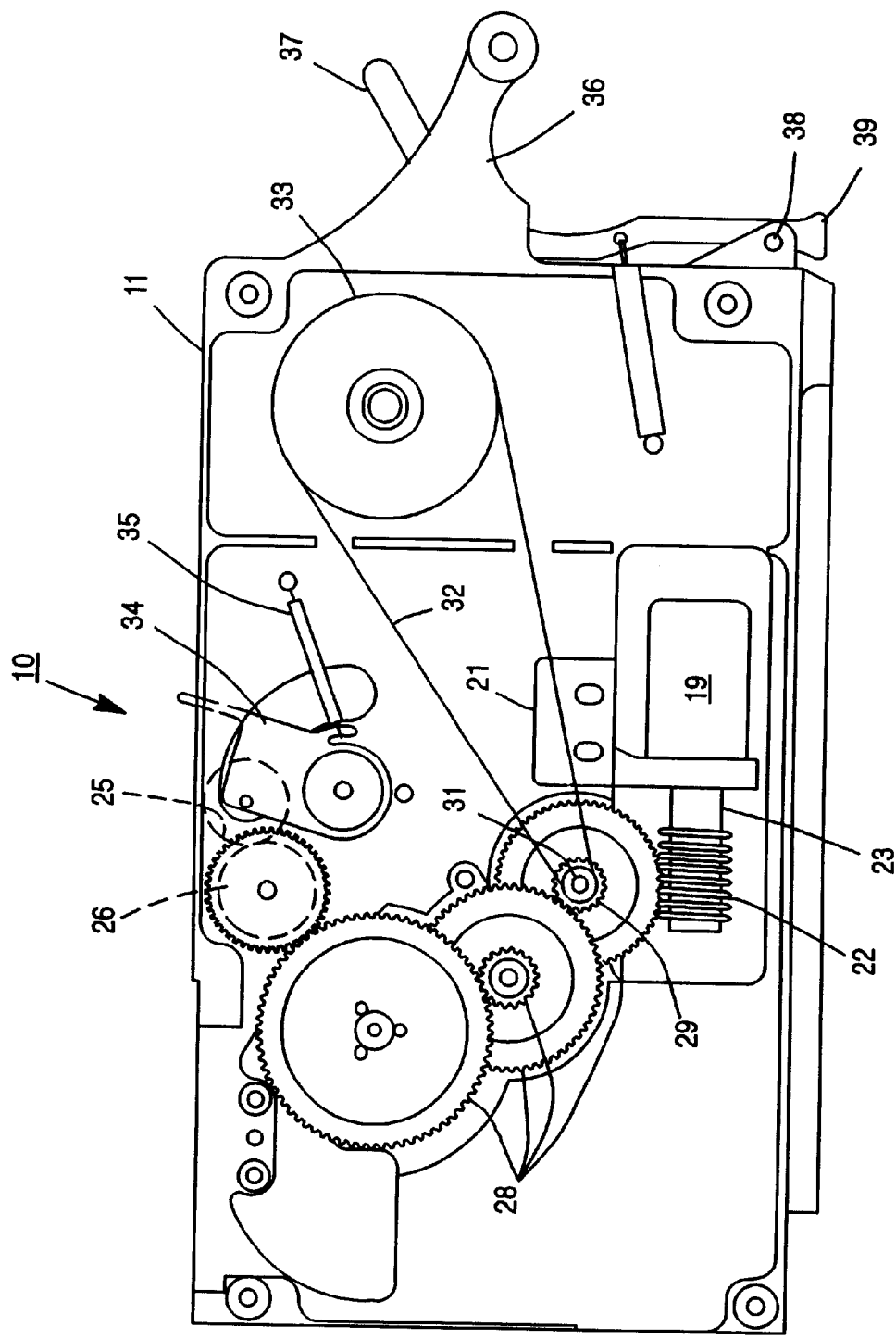
FIG. 2 is a left side elevation view of the prior art tape feeder of FIG. 1 with the left side cover plate removed to show the tape drive gearing.

Refer now to FIG. 2 showing a left side elevation view of the tape feeder 10 shown in FIG. 1. The frame or base 11 is shown having the drive motor 19 mounted on a bracket 21 and having a shaft 23 which supports the worm gear 22 for driving a plurality of external spur gears 28. One of the external spur gears 29 is shown having a tape take up reel drive pulley 31 which drives a resilient drive belt 32 and the take up reel pulley 33 which connects to the take up reel. In addition to driving the take up reel 27, the external spur gears are shown engaging the drive gear for the drive roll 26 which engages the pinch roll 25 mounted on a pinch roll lever 34. Pinch roll lever 34 is pivoted and urged into engagement with the drive roller 26 by a spring 35.

The tape feeder 10 is mounted in a pick and place machine in slots especially adapted to position the tape feeder at a precise position. In order to remove the tape feeder 10 there is provided a handle 36 and a latch lever 37 which is pivoted at pivot 38 to articulate the latch 39. Latch 39 is engagable into a support guide for releasably engaging the tape feeder 10 from the pick and place machine.

Figure 3:
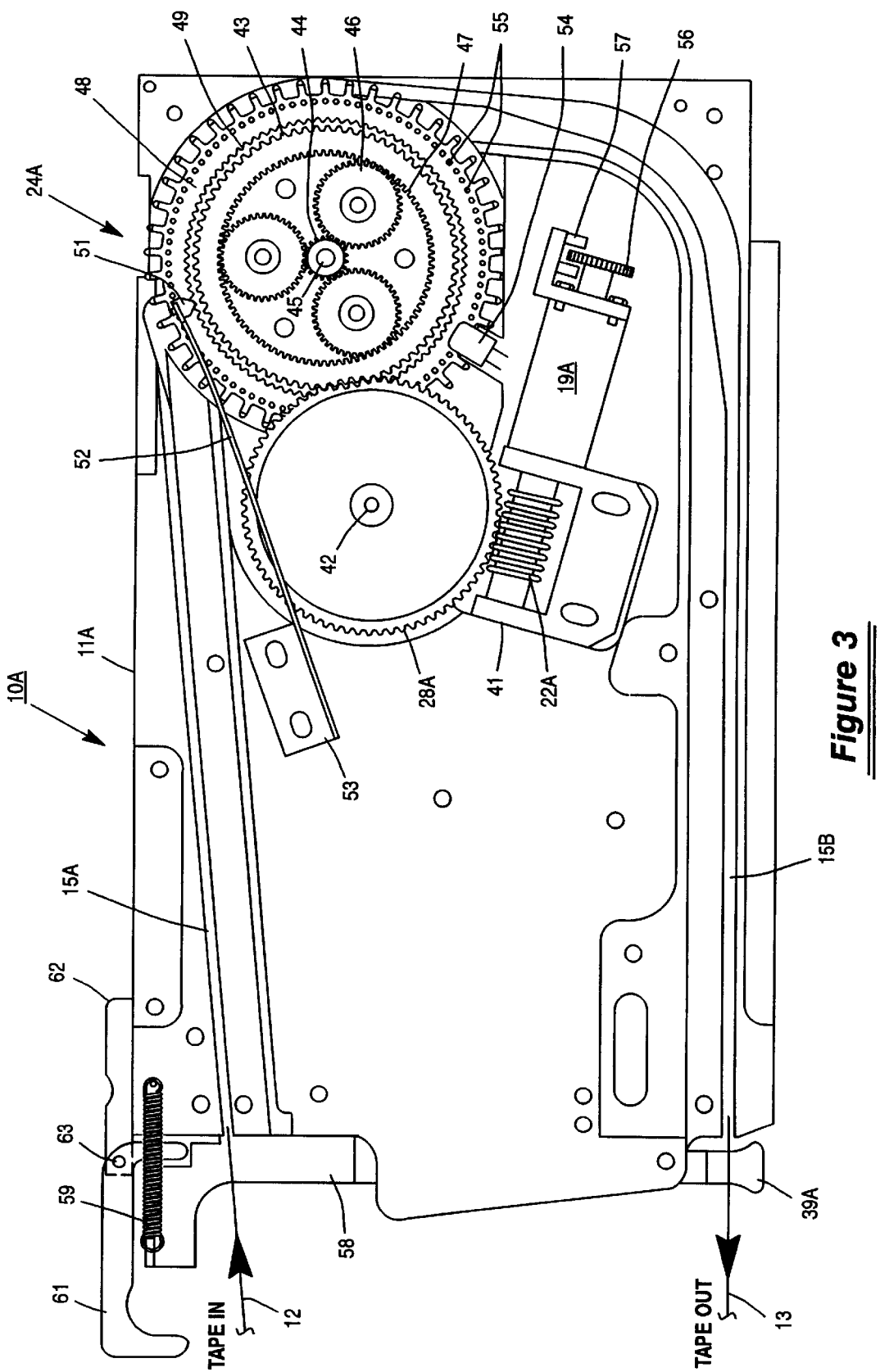
FIG. 3 is a right side elevation view of the present invention's tape feeder with the right side cover plate removed to show the novel feed path of a component tape and the drive mechanism for the sprocketed wheel.

Refer now to FIG. 3 showing a right side elevation view of a preferred embodiment of the present invention tape feeder 10A. In this embodiment, the component tape 12 is shown being presented into a tape slot 15A and presented directly to the workstation 24A. It will be observed that the component tape 12 has a direct path to the work station and does not incur any reverse bends which would cause delamination before the cover tape 14 is removed from the carrier tape 13. It will be noted that the sprocket wheel 48 having highly precisioned sprocket teeth positions the component tape 12 in the work station at the time the component is picked from the carrier tape 13, thus, controlling the position of the component tape 12 even while it passes through the work station 24A.

Drive motor 19A is shown having a worm gear 22A mounted by a bifurcated bracket 41 which mounts on the base or frame 11A. Worm gear 22A drives an external spur gear 28A pivoted on gear axle or shaft 42. The external gear 28A engages and drives an external gear 43 which has mounted thereon a sun gear 44 that moves with the gear 43. Gear 43, 44 is mounted on an axle or shaft 45 and in turn simultaneously drives three planet gears 46 which engage an internal spur gear 47 which comprises a part of the novel sprocket wheel or sprocket gear 48. In summary, the drive motor 19A drives a sun gear 44 which causes the sprocket wheel 48 to be moved and positioned in a gross position at the workstation 24A.

The novel sprocket wheel 48 comprises a positioning cam 49 mounted thereon which engages a pawl 51 which becomes a pawl shaped drive cam 51 that is mounted on a spring arm 52 which is supported by a spring block or bracket 53.

In the preferred mode of operation, the drive motor 19A takes all of the slack out of the drive gears and the pawl 51 prevents the sprocket wheel 48 from turning until all of the backlash in the gear set is removed. Once this occurs, the tape sprocket teeth on the sprocket wheel 48 will advance. As the sprocket wheel 48 advances, a sprocket index sensor 54 senses the holes 55 in the sprocket wheel 48, thus detecting the motion of the sprocket gear by sensing the presence of a hole which is aligned radially with the teeth of the sprocket gear. Immediately upon detecting the predetermined hole, a predetermined number of pulses are counted and the motor is stopped. To provide the pulses and the exact gross position desired a tachometer wheel 56 is coupled to the drive motor 19A and its position is sensed by pulses in the tachometer wheel 56 by tachometer sensor 57. Thus, it will be understood that the drive motor 19A is capable of taking all of the backlash out of the drive gears and positioning the desired sprocket teeth at the work station 24A at a predetermined gross position.

As will be explained in detail hereinafter, the pawl 51 rides up on the cam 49 and moves over the crown of the cam where it becomes a positioning cam and causes the spring force in the spring 52 to now position the positioning cam 49 to a fine position which continues forward movement without conflicting with the drive of the drive motor 19A. Stated differently, the drive motor takes all of the backlash out of the gears and pulls the component tape 12 to a gross position. When the drive motor 19A is deactivated the positioning pawl 51 then drives the novel sprocketed wheel 48 forward again placing backlash into the gear system and positioning the novel sprocketed wheel 48 at a final fine position.

The latch 39A is shown at the foot of new latch configuration latch arm 58 which terminates with a spring retainer at spring 59 and is urged toward the frame 11A. A mounting block 62 is shown attached to frame 11A and carries on it a pivot pin 63 for pivotally supporting a latch handle 61. This improved latch handle enables an operator to perform latching and/or removing of a tape feeder with one hand.

Figure 4:
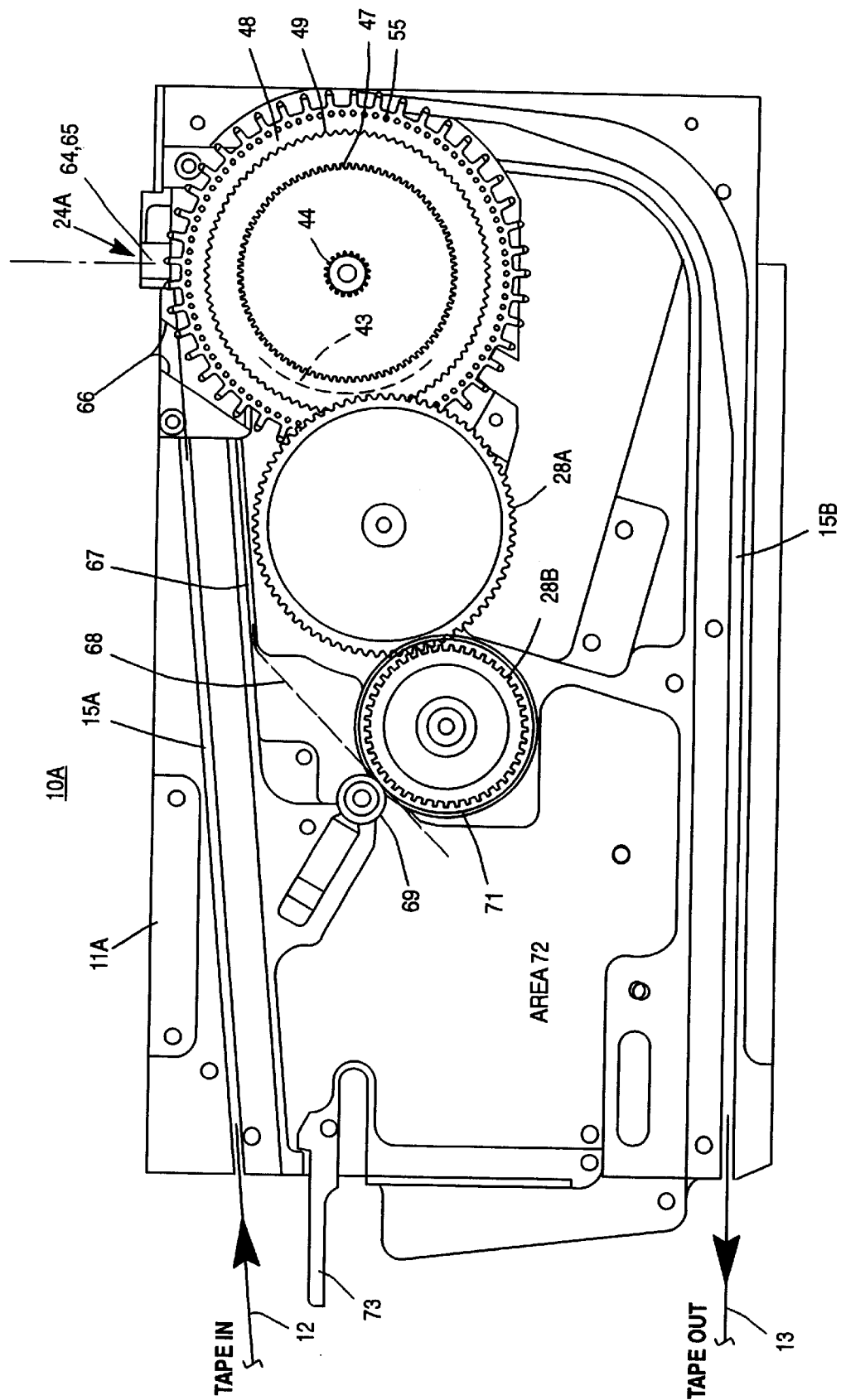
FIG. 4 is a right side elevation view of the present invention frame or base showing the path of the cover tape after being stripped from the carrier tape.

Refer now to FIG. 4 showing a right side elevation view of the present invention frame or base 10A showing the tape path of the cover tape 14 after being stripped from the carrier tape. Tape 12 is shown entering the guide slot 15A. The component tape 12 remains substantially linear until it reaches the pick up station 24A where the pockets in the carrier tape are exposed by removing the cover tape 14 which is stripped back and guided into a substantially vertical slot 66 and passes into a substantially horizontal passageway 67 and is shown at cover tape path 68 passing through a pinch roller 69 and a drive roller 71 where it exits into a stuff box which may be provided in area 72. A stuff box door 73 is provided with a latch and a pivot to allow it to be pivoted outward and downward to have access to the stuff box area and the cover tape 14.

A nozzle sensor 64, 65 is provided at the pick up station so that when the nozzle removes a component from the pocket in the component tape it is sensed when the nozzle rises with the component thereon so as to initiate advancement of the sprocket wheel and to bring a new component into the pick up position as will be explained in greater detail hereinafter.

Figure 4A:
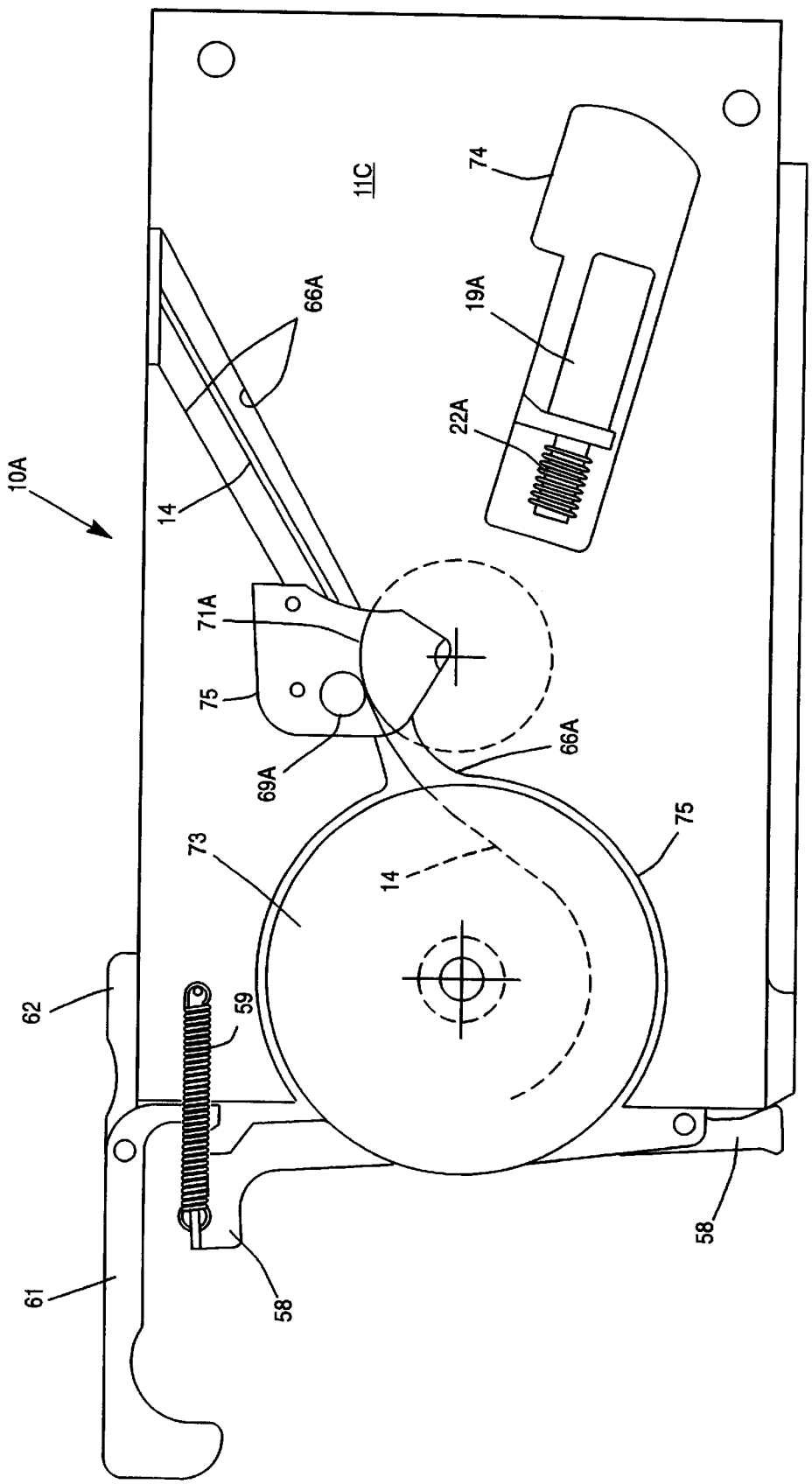
FIG. 4A is a right side elevation view of another preferred embodiment tape feeder showing a take up reel in place of a stuff box and a pinch roll in a changed position.

Refer now to FIG. 4A showing a right side elevation view of another preferred embodiment tape feeder having a take up reel 73 in place of the stuff box. In this embodiment a cover plate 11C is shown mounted onto the base or frame 11A which is recessed at the leftmost edge to provide an open access for the take up reel 73. The cover tape 14 is stripped from the carrier tape 13 and guided down a shallow recess or guide 66A into the take up reel 73. The cover tape 14 is pulled from its carrier tape 13 by pinch roll 69A and drive roll 71A which is actuated by the drive motor 19A. An access area 75 is provided at the pinch rolls to feed the tape through the two rolls and an additional access area 74 is provided for access to the drive motor 19A. The opening 75 in the cover plate 11C leaves the take up reel 73 exposed and flush with the cover plate 11C. This embodiment also includes the preferred embodiment latch release explained hereinbefore.

Figure 5:
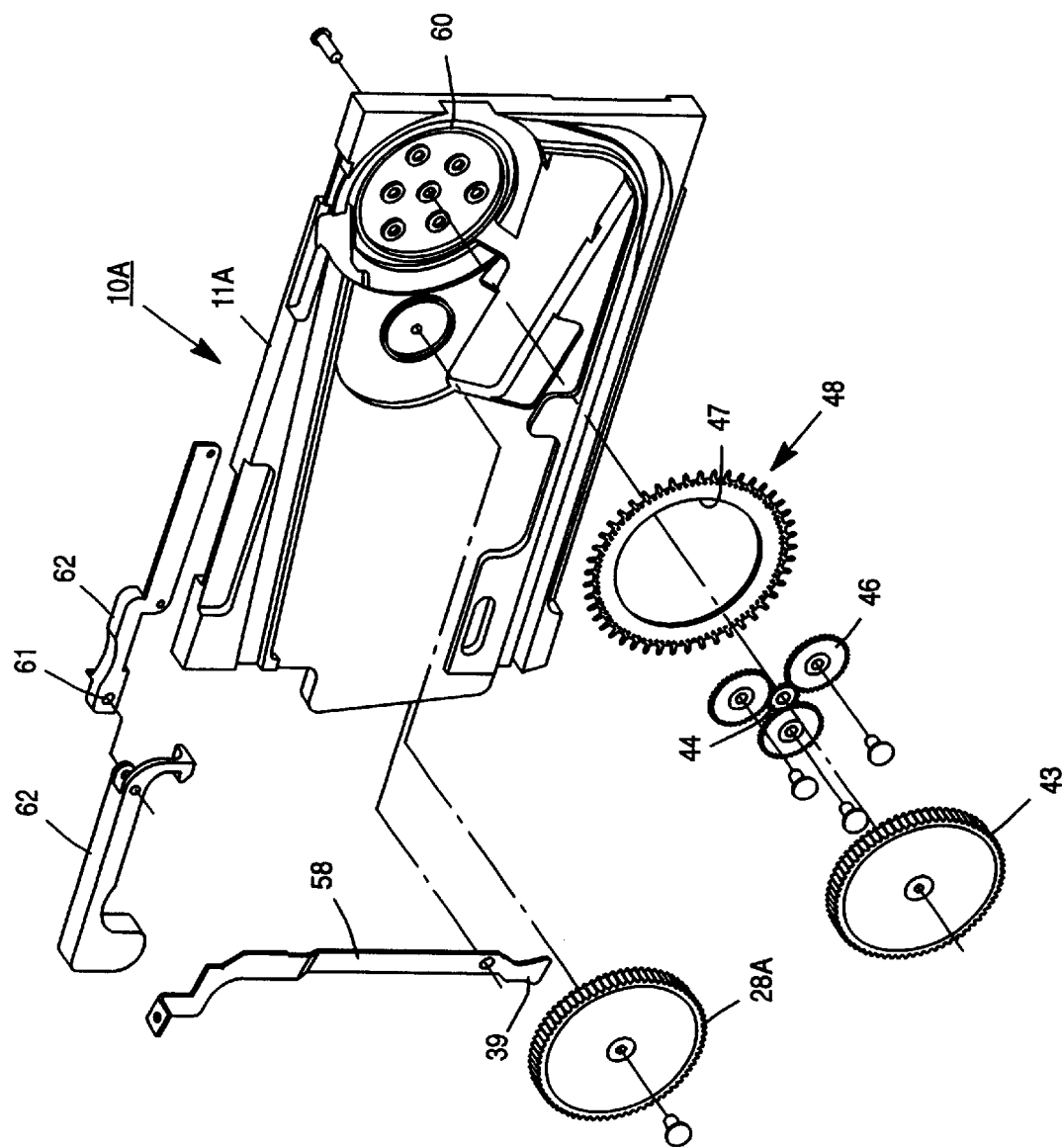
FIG. 5 is an exploded view of the drive gears employed to drive the sprocketed wheel to a gross position.

Refer now to FIG. 5 showing an exploded view of the drive gears employed to drive the sprocket wheel 48 to a gross position. In this embodiment, the external spur gear 43 and sun gear 44 are shown disconnected from each other but as explained hereinbefore are made as a single piece. The sprocket wheel sprocketed gear 48 is shown having an internal spur gear 47 which engages the planetary gears 46 which in turn engage the sun gear 44 which is mounted on the external spur gear 43. Gear 28A engages gear 43 as explained hereinbefore. There is shown a raised guide ring 60 which is part of the frame 11A which provides the radial locating means for the sprocket wheel 48 as will be explained in greater detail hereinafter.

Figure 6:
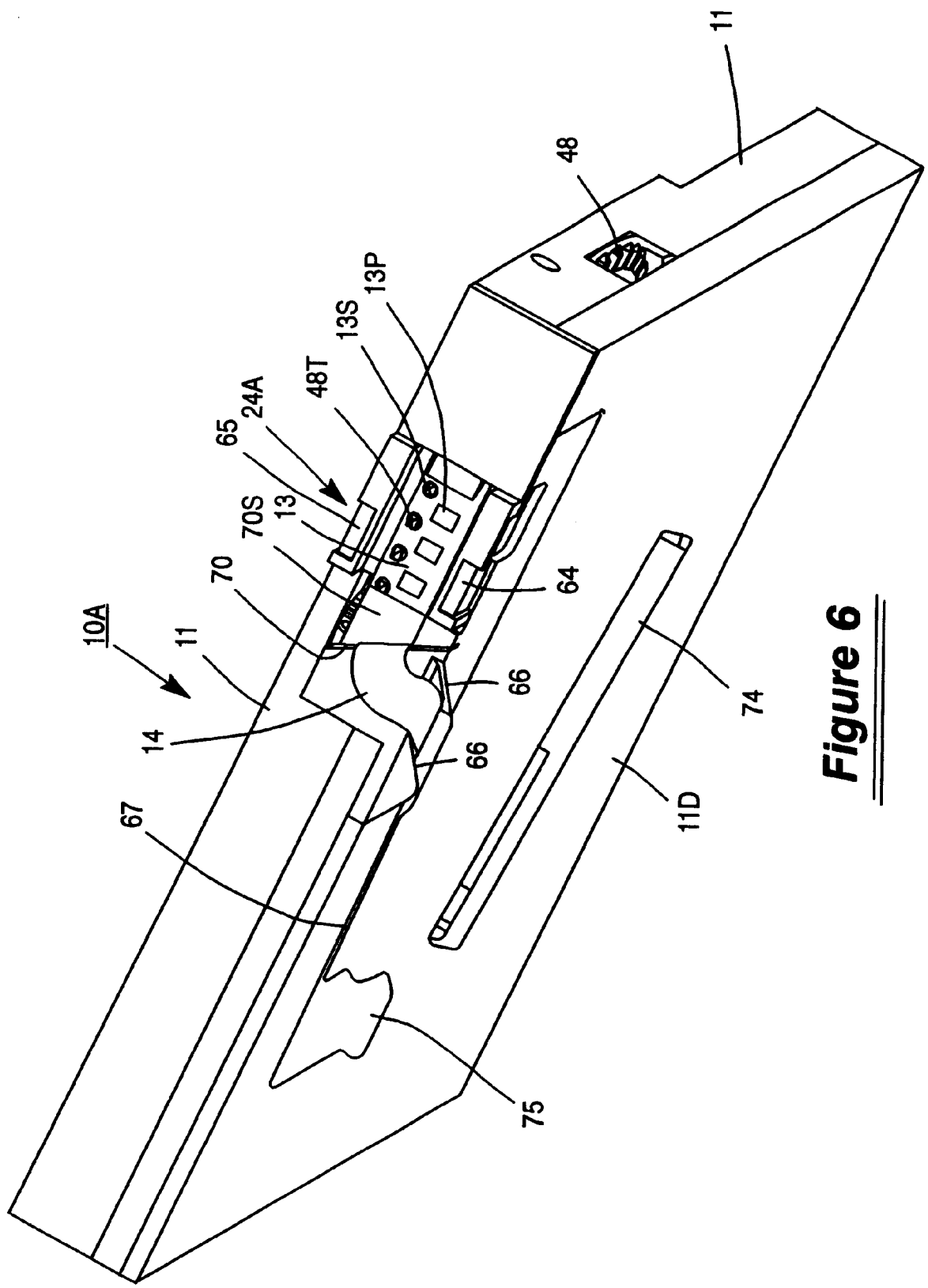
FIG. 6 is an isometric view of the tape feeder with side covers attached looking down on the pick up station as the cover tape is removed from the carrier tape.

Refer now to FIG. 6 showing an isometric view of the tape feeder with side covers attached looking down on the pick up station as the cover tape is removed from the carrier tape 13. The carrier tape 13 is shown having rectangular component pockets 13P and round sprocket holes for mating with the teeth 48T of the teeth on the sprocket wheel 48. The cover tape 14 is shown emerging from a slit 70 in the stripper block 70S. It will be understood that the components in the pockets 13P do not emerge from under the stripper block 70S until they are ready to emerge at the pick up station 24A. Stated differently, the component which is positioned between the nozzle sensor 64, 65 will be the only exposed component in all of the component tape 12. The cover tape 14 is shown being guided by a cover tape guide 66 where it is twisted and enters into the horizontal portion 67 of the cover tape guide. Access openings 74 and 75 are the same as those employed on FIG. 4A and do not require additional explanation herein.

Figure 7:
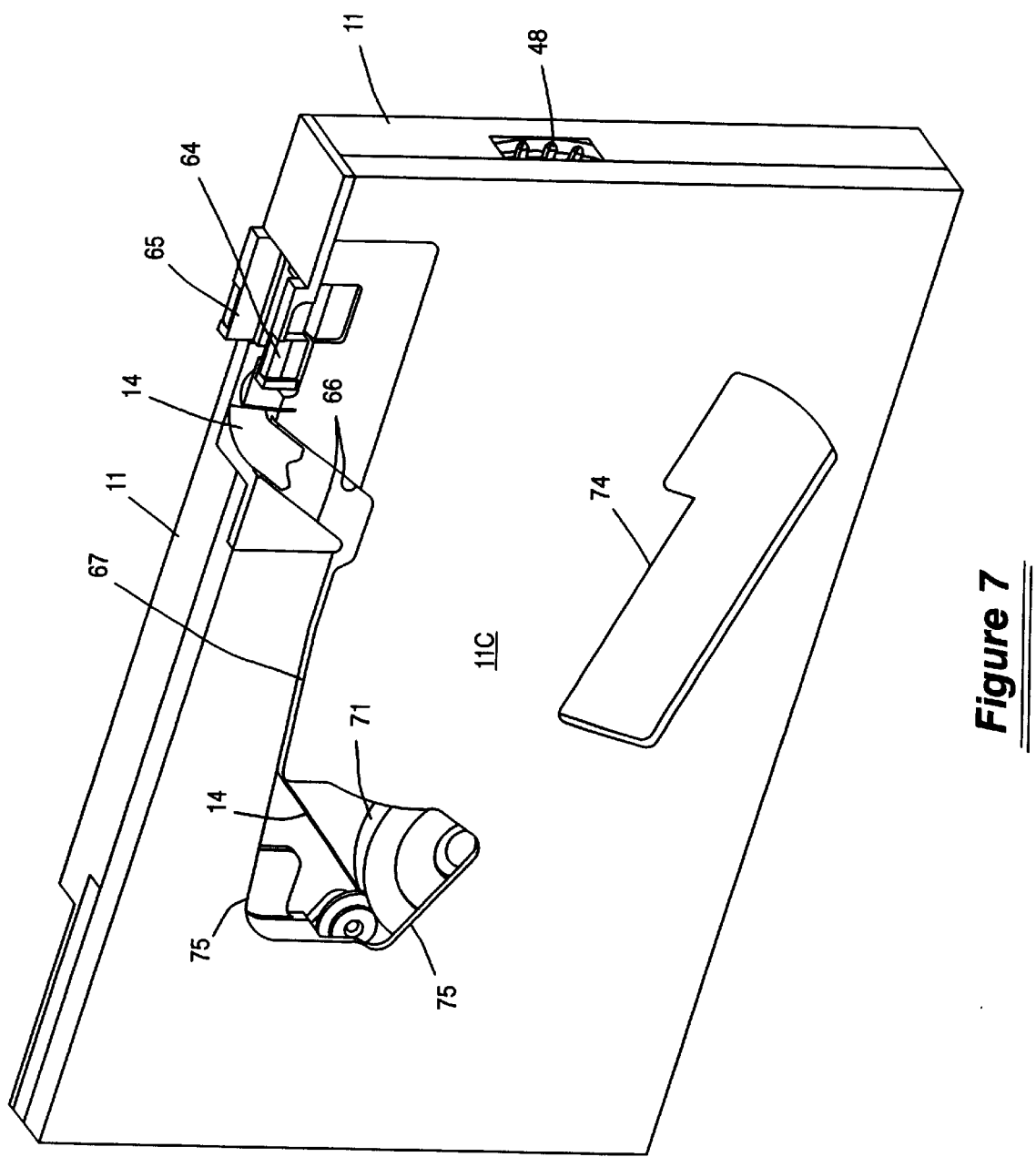
FIG. 7 is an isometric view of the tape feeder of FIG. 6 taken from the right side showing access slots in the right side cover plate for positioning the cover tape.

Refer now to FIG. 7 showing an isometric view of the tape feeder of FIG. 6 taken from the right side showing access slots in the right side cover plate. The access openings 74 and 75 in the cover plate are substantially the same as those previously shown in FIG. 4A and do not require additional explanation. The cover tape 14 is shown passing between the pinch roll 69 and the drive roll 71. Other numerals provided on FIG. 7 are the same as those used in previous figures and do not require additional explanation.

Figure 8:
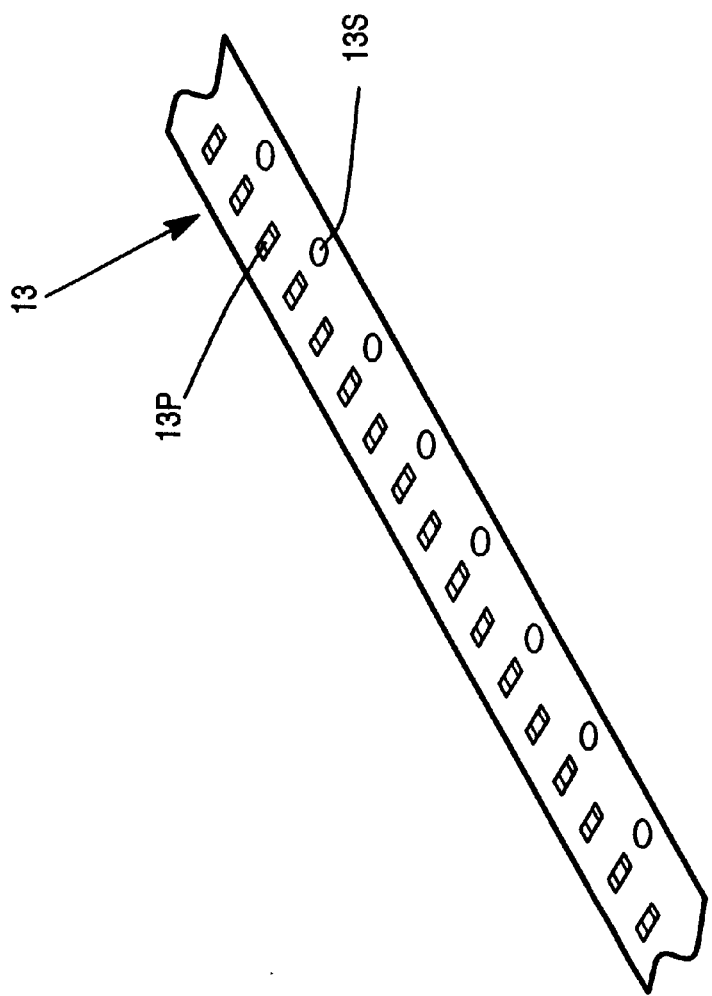
FIG. 8 is an isometric view of a carrier tape showing sprocket holes and component pockets.

Refer now to FIG. 8 showing an isometric view of a carrier tape 13 showing the round sprocket holes 13S which conform to the EIA specification and the component pockets 13P therein. In the preferred embodiment shown, the sprocket teeth 48T on the sprocket wheel 48 engage the topmost portion of their teeth in the round holes. The tape 13 is not forced down to the complete length of the tooth as will be explained hereinafter.

Figure 9:
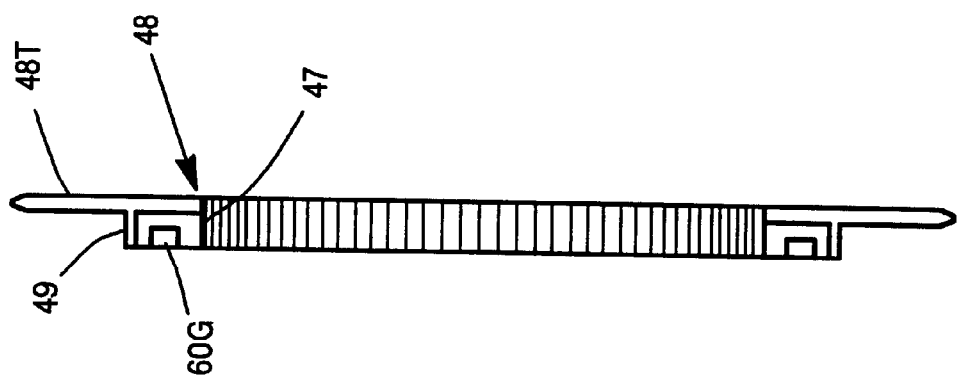
FIG. 9 is a cross-section taken through the novel sprocketed wheel.

Refer now to FIG. 9 showing a cross section taken through the novel sprocket wheel 48. Sprocket wheel 48 has teeth 48T which have a substantially tight fit in the sprocket holes 13S when the tape 13 is urged to the topmost portion of the tooth and not engaged fully thereon. Sprocket wheel 48 is provided with an annular recess or groove 60G in which the aforementioned radial locator or guide ring 60 engages for maintaining its radial position. The fine positioning cam 49 and the internal spur gear 47 are numbered for purposes of coordinating FIG. 9 with the enlarged views which will now be explained.

Figure 10:
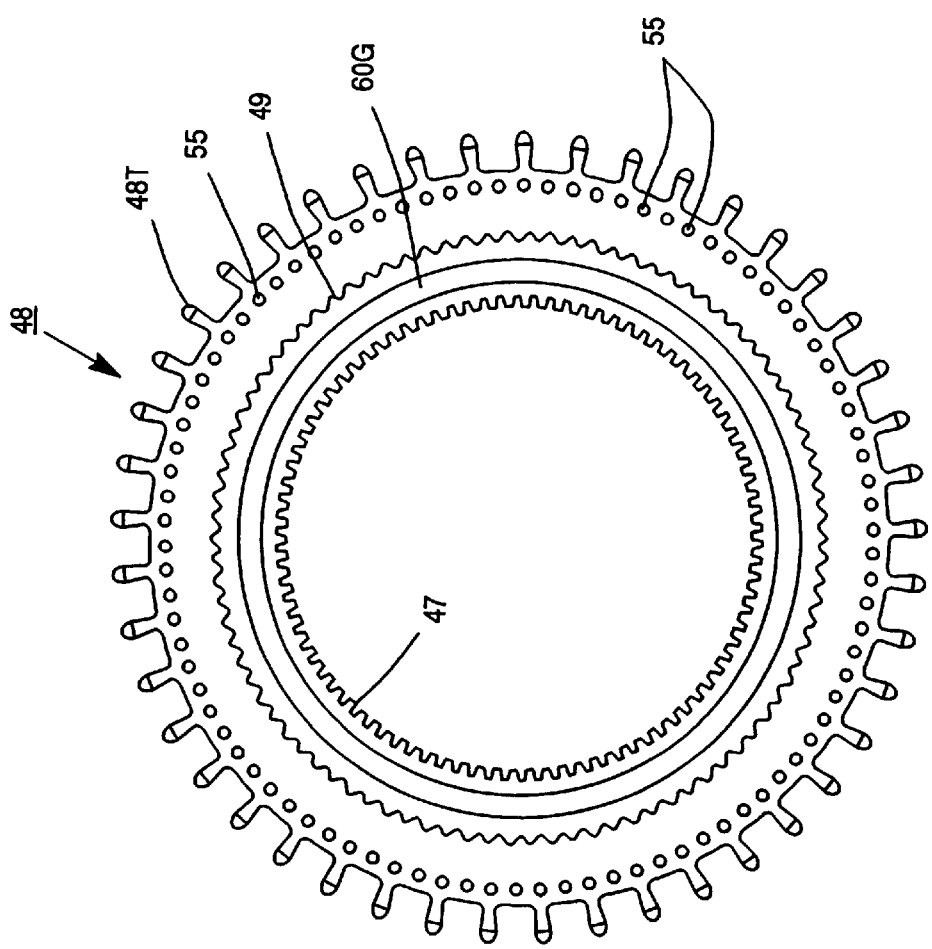
FIG. 10 is an enlarged left side view of the sprocketed wheel of FIG. 9.

Refer now to FIG. 10 showing an enlarged left side view of the sprocketed wheel 48 shown in FIG. 9. The sprocket wheel 48 comprises teeth 48T, sprocket holes 55, positioning cam 49, an annular positioning groove 60G, and internal spur gear 47. It will be noted that the teeth 48T are slightly tapered and more narrow at their base to prevent the tape 13 from binding in the lower root of the tooth.

Figure 11:
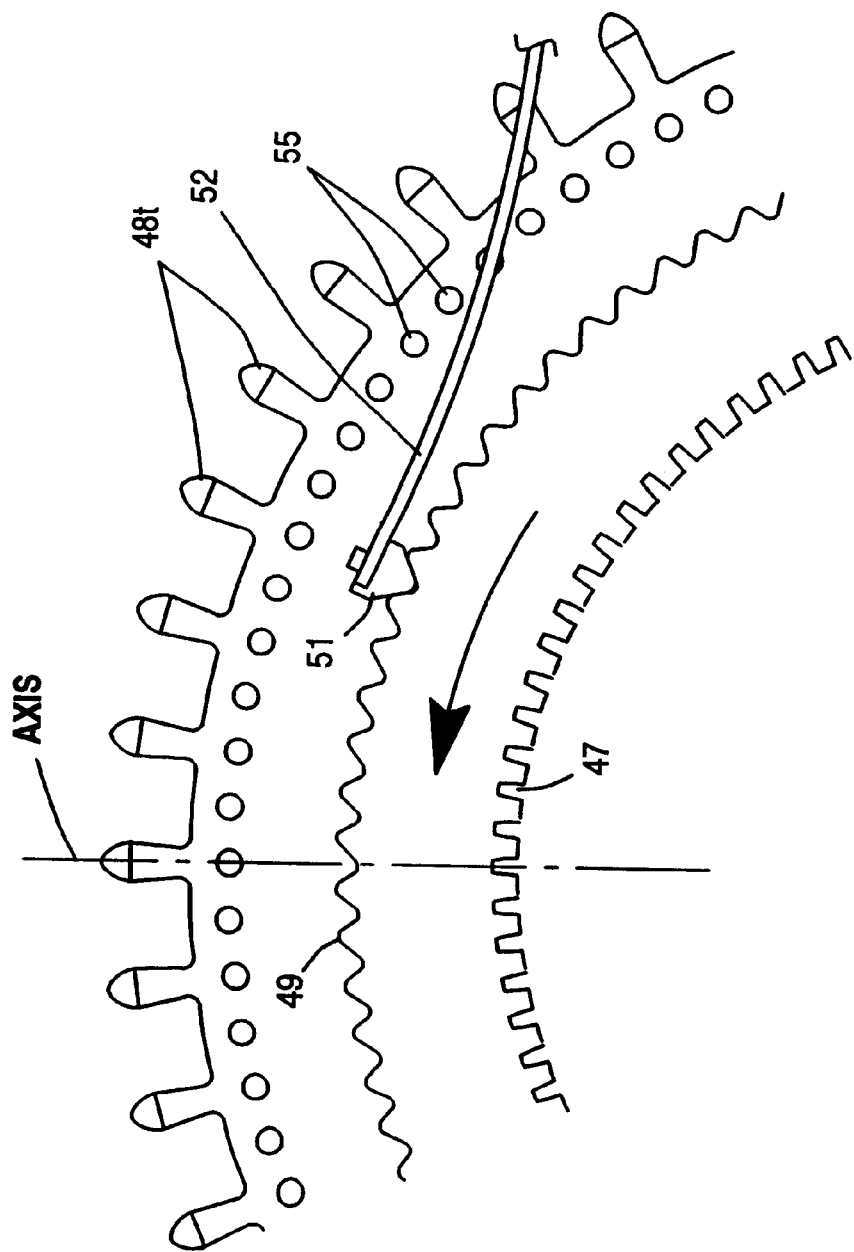
FIG. 11 is an enlarged partial view of the sprocketed wheel of FIG. 10 showing a spring-loaded positioning actuating cam in a cam recess.

Refer now to FIG. 11 showing an enlarged partial view of the sprocketed wheel 48 shown in FIG. 10. The numerals on FIG. 11 are identical to those shown in previous figures and represent the same structure and embodiment explained hereinbefore. FIG. 11 is employed to show how the fine positioning cam pawl 51 mounted on spring arm 52 is capable of advancing the sprocket wheel 48 in the direction of the arrow. In the preferred embodiment of the present invention, the sprocket wheel is moved in the direction of the arrow by the drive motor 19A until pawl 51 passes over the apex of the cam 49. As it starts its downward movement into the cam slot, shown as a vee-shaped cam, the sensor 54 senses the position of the sprocket holes 55 and deactivates the drive of the drive motor 19A leaving the leftmost cam face of the drive cam pawl 51 to move the sprocket wheel 48 counter clockwise by cam action until it nests and fits tightly in the mating groove of the sprocket positioning cam 49.

Having explained how the drive cam 51 is capable of exactly positioning the positioning cam 49, it will be understood that the teeth 48T on the sprocketed wheel are also engaged in the sprocketed tape 13 at the pick up station 24A. By maintaining this tight position in the sprocket hole 13S the sprocket teeth 48T position the pockets 13P in the pick up station 24A as accurately as the tape can be manufactured. In the preferred embodiment of the present invention, it has been found that the carrier tape 13 can be positioned to an accuracy of ± one $1,000^{th}$ of one inch relative to the axis of the pick up station and the pick up tool. It is believed that this increased accuracy is at least one-half of one order of magnitude greater than the accuracy available in prior art devices.

Having explained the preferred embodiments of the present invention, it will be understood that the novel sprocketed wheel 48 employs an entirely new and preferred mode of operation which allows the drive motor 19A to gross position the carrier tape 13 and the drive cam pawl 51 to fine position the sprocketed wheel 48 after the drive motor has terminated its driving force so that after all backlash is taken from the gearing system the positioning pawl 51 only needs to move the sprocketed wheel forward in a counter clockwise direction again placing some backlash in the system but achieving fine positioning which can be as accurate as the sprocket holes in the carrier tape 13.

What is claimed is:

1. An automatic tape feeder for use in a component placement machine, comprising:

a base frame, a drive motor mounted on said base frame, a plurality of reduction gears mounted on said base frame and driven by said drive motor, a sprocket wheel mounted on said base frame and driven by said reduction gears for positioning a component carrier tape to a first or gross position at a pickup position of said tape feeder, indexing cam means connected to said sprocket wheel for moving said sprocket wheel to a second or precise position, spring means mounted on said base frame, and an actuating cam mounted on said spring means for engaging said indexing cam means and for positioning a predetermined sprocket tooth on said sprocket wheel to said precise position.

2. An automatic tape feeder as set forth in claim 1 wherein said actuating cam comprises a vee-shaped cam follower and positioner.

3. An automatic tape feeder as set forth in claim 2 wherein said vee-shaped cam is mounted on a spring block element and supported on said base frame.

4. An automatic tape feeder as set forth in claim 1 wherein said indexing cam means comprises a plurality of inverted vee-shaped cam elements formed as a continuous ring on said sprocket wheel.

5. An automatic tape feeder as set forth in claim 4 wherein said indexing cam means comprises at least two cam elements for each sprocket tooth on said sprocket wheel.

6. An automatic tape feeder as set forth in claim 1 wherein said sprocket wheel further includes sensing apertures positioned relative to said sprocket teeth, and a photo optic sensor juxtaposed said sensing apertures for sensing the gross position of said sprocket wheel.

7. An automatic tape feeder as set forth in claim 6 which further includes drive control means for initiating positioning movement of said sprocket wheel to a gross position, and said drive control means being responsive to said photo optic sensor to cease drive movement of said sprocket wheel by said drive motor before said fine position is reached.

8. An automatic tape feeder as set forth in claim 1 wherein said tape feeder comprises a cover plate for guiding a carrier tape onto said sprocket wheel and preventing components from escaping from recessed pockets in said carrier tape, and a diagonal slot in said cover plate for stripping a cover tape from a carrier tape as it is moved to the pick-up position of the tape feeder.

9. An automatic tape feeder as set forth in claim 1, which further includes a stationary cover plate and stripping means mounted on said base frame at said pick-up position.

10. A method of accurately positioning a sprocket wheel of a tape feeder used in a component placement machine, comprising the steps of:

mounting an indexing cam means on said sprocket wheel, driving said sprocket wheel to a gross position short of a final desired position employing a drive motor, sensing said gross position of said sprocket wheel, coupling an actuating cam to a spring, loading a force in said spring by employing said drive motor, and driving said sprocket wheel to said final desired position employing said actuating cam engaging said indexing cam means.

11. A method as set forth in claim 10 wherein said step of loading a force in said spring comprises engaging a face of the actuating cam on a face of said indexing cam, and loading a spring force in said spring by said step of driving said sprocket wheel to said gross position.

12. A method as set forth in claim 11 wherein said step of driving said sprocket wheel to a gross position employing said drive motor is ceased while driving said sprocket wheel to said final desired position with said actuating cam.

13. An automatic tape feeder for use in a component placement machine, comprising:

a base frame, a direct current drive motor mounted in said base frame, a plurality of drive gears mounted on said base frame and driven by said drive motor, a sprocket wheel driven by some of said drive gears for positioning a component tape in a pick-up position, said component tape comprising a cover tape releasably bonded to a carrier tape having recessed pockets for receiving components therein, a component tape guide path in said base frame forming a straight path from outside of said tape feeder to said pick-up position, a combination cover plate and cover tape stripper for removing said cover tape and guiding said carrier tape to said pick up position and for exposing only one component in a recessed pocket at said pick-up position, a diagonal slit in said cover plate for separating and removing said cover tape from said carrier tape, and cover tape take-up means for removing said cover tape from said diagonal slit.

14. An automatic tape feeder as set forth in claim 12 which further includes a vertical guide path in the side of said combination cover plate for guiding a cover tape to said cover tape take-up means in said tape feeder.

15. An automatic tape feeder as set forth in claim 14 which further includes a friction drive roll mounted on one of said drive gears for pushing said cover tape into a stuff box in said tape feeder.

16. An automatic tape feeder as set forth in claim 12 which further includes friction drive means mounted on one of said drive gears for stripping a cover tape from a carrier tape and for supplying the cover tape to the cover tape take-up means.

* * * * *